(12) United States Patent
Nakai et al.

(10) Patent No.: US 8,241,421 B2
(45) Date of Patent: Aug. 14, 2012

(54) EPITAXIAL WAFER AND PRODUCTION METHOD THEREOF

(75) Inventors: Katsuhiko Nakai, Yamaguchi (JP);
Timo Mueller, Burghausen (DE);
Atsushi Ikari, Yamaguchi (JP); Wilfried von Ammon, Hochburg (AT); Martin Weber, Kastl (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 12/895,950

(22) Filed: Oct. 1, 2010

(65) Prior Publication Data

US 2011/0084366 A1 Apr. 14, 2011

(30) Foreign Application Priority Data

Oct. 8, 2009 (JP) ................. 2009-234494

(51) Int. Cl.
 *H01L 21/00* (2006.01)
(52) U.S. Cl. ........... 117/19; 438/500; 438/503; 428/620
(58) Field of Classification Search .......... 438/478–481, 438/620, 500, 503; 117/19
See application file for complete search history.

(56) References Cited

U.S. PATENT DOCUMENTS

| | | | |
|---|---|---|---|
| 5,935,320 A | 8/1999 | Graef et al. | |
| 6,191,009 B1 | 2/2001 | Tamatsuka et al. | |
| 6,299,982 B1 | 10/2001 | Tamatsuka et al. | |
| 6,365,461 B1 | 4/2002 | Asayama et al. | |
| 6,548,035 B1 | 4/2003 | Kimura et al. | |
| 6,548,886 B1 | 4/2003 | Ikari et al. | |
| 2002/0083889 A1 | 7/2002 | Falster et al. | |
| 2003/0056715 A1 | 3/2003 | Tachikawa et al. | |
| 2003/0079674 A1 | 5/2003 | Tachikawa et al. | |
| 2003/0134520 A1 | 7/2003 | Tachikawa et al. | |
| 2003/0148634 A1 | 8/2003 | Holzl et al. | |
| 2003/0172865 A1 | 9/2003 | Iida | |
| 2004/0192015 A1 | 9/2004 | Ammon et al. | |
| 2004/0194692 A1 | 10/2004 | Nishikawa et al. | |
| 2006/0225640 A1 | 10/2006 | Ono et al. | |
| 2007/0155134 A1 | 7/2007 | Nakai et al. | |
| 2007/0218570 A1 | 9/2007 | Nakamura et al. | |
| 2008/0096371 A1 | 4/2008 | von Ammon et al. | |

FOREIGN PATENT DOCUMENTS

| | | |
|---|---|---|
| JP | 2000-109396 A | 4/2000 |
| JP | 2000281491 A | 10/2000 |
| JP | 2002179496 A | 6/2002 |
| JP | 3589119 | 8/2004 |
| JP | 2004224642 A | 8/2004 |
| JP | 2008-100906 A1 | 5/2008 |
| JP | 2008150283 A | 7/2008 |

OTHER PUBLICATIONS

W. Zulehner et al., Crystal Growth, "Properties and Applications", p. 28, Springer-Verlag, New York 1982.

(Continued)

*Primary Examiner* — Richard A. Booth
(74) *Attorney, Agent, or Firm* — Brooks Kushman P.C.

(57) ABSTRACT

The epitaxial layer defects generated from voids of a silicon substrate wafer containing added hydrogen are suppressed by a method for producing an epitaxial wafer by:
 growing a silicon crystal by the Czochralski method comprising adding hydrogen and nitrogen to a silicon melt and growing from the silicon melt a silicon crystal having a nitrogen concentration of from $3 \times 10^{13}$ cm$^{-3}$ to $3 \times 10^{14}$ cm$^{-3}$,
 preparing a silicon substrate by machining the silicon crystal, and
 forming an epitaxial layer at the surface of the silicon substrate.

9 Claims, 7 Drawing Sheets

OTHER PUBLICATIONS

M. Lida et al., Defects in Silicon, "Effects of Light Element Impurities on the Formation of Grown-in-Defects Free Region of Czochralski Silicon Single Crystal", T. Abe, W.M. Bullisetal (ECS., Pennington N.J., 1999) 499).

V.V. Voronkov, K. Crystal Growth, 59 (1982) 625, "The Mechanism of Swirl Defects Formation in Silicon".

T. Abe et al., Mat. Res. Soc. Symp. Proc. vol. 262, 3 1992 "Dynamic Behavior of Intrinsic Point Defects in FZ and CZ Silicon Crystals".

SEMI (Semiconductor Equipment and Materials International), Test Method for Measuring Nitrogen Concentration in Silicon Substrates by Secondary Ion Mass Spectrometry, SEMI MF2139-1103 (Reapproved 1110), originally published by ASTM International as ASTM F2139-01, Nov. 2003.

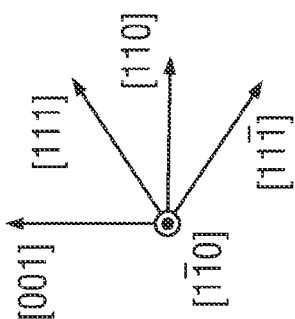
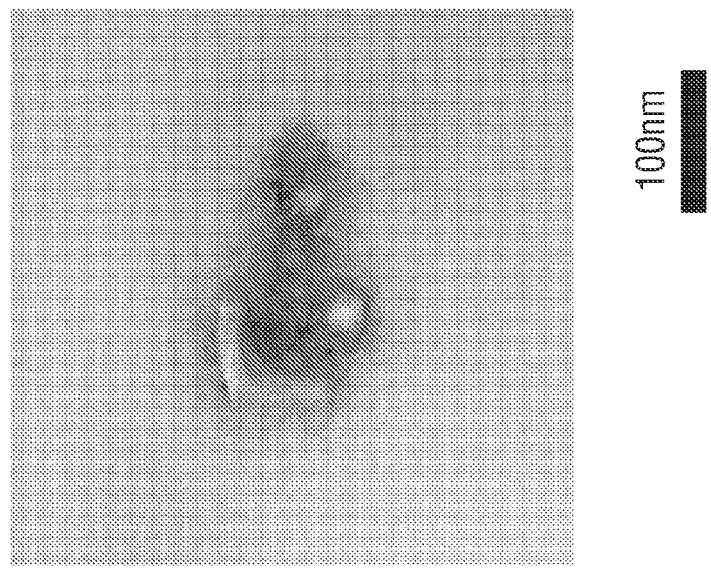
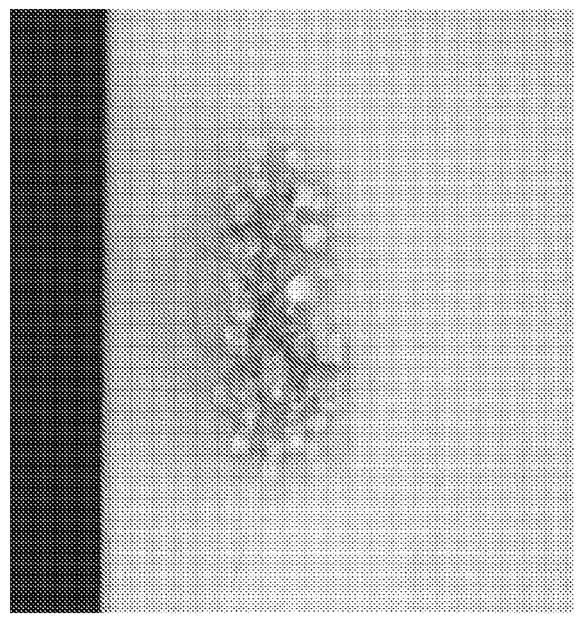
Fig. 4

Fig. 6
Hydrogen addition
Hydrogen, Nitrogen concentration
Optimized cooling condition
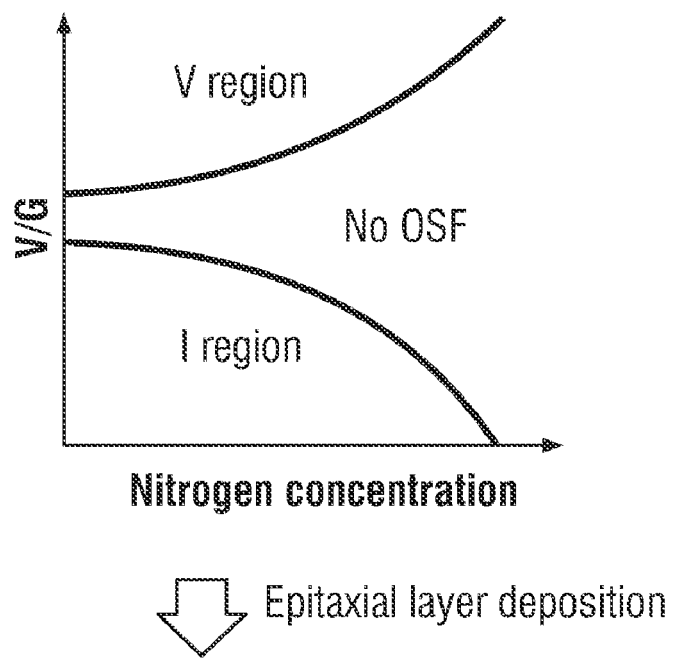
⇩ Epitaxial layer deposition
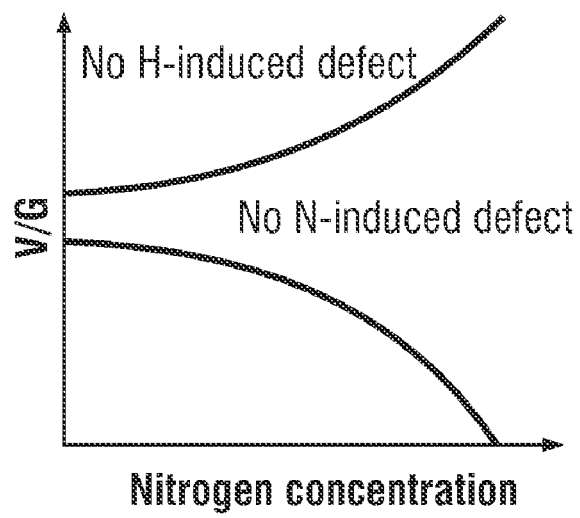

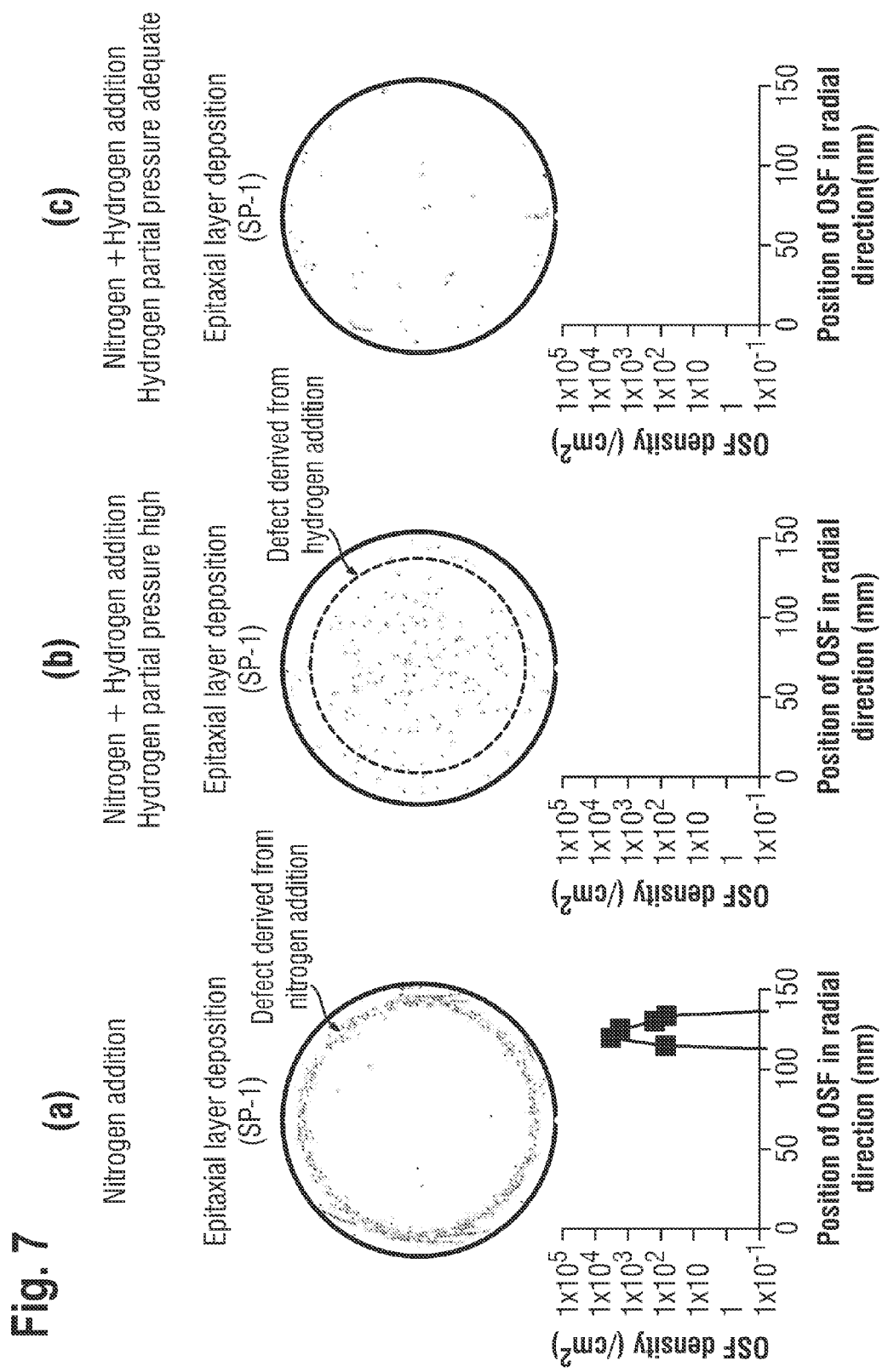

EPITAXIAL WAFER AND PRODUCTION METHOD THEREOF

CROSS-REFERENCE TO RELATED APPLICATIONS

This application claims priority to Japanese Patent Application No. JP2009234494 filed Oct. 8, 2009 which is herein incorporated by reference.

BACKGROUND OF THE INVENTION

1. Field of the Invention

The present invention relates to an epitaxial wafer and a production method thereof. More specifically, the present invention relates to a method for producing an epitaxial wafer comprising a step of growing a silicon crystal by the Czochralski method wherein hydrogen and nitrogen are added to a silicon melt, a step of preparing a silicon substrate by machining said silicon crystal, and a step of forming an epitaxial layer at the surface of the silicon substrate.

2. Background Art

With the progress of semiconductor devices in recent years, increasingly severe control of crystal quality of silicon wafers has been demanded. Especially, device characteristics, in particular Gate Oxide Integrity, can be deteriorated by defects such as grown-in defects existing in a silicon wafer produced by cutting a silicon crystal after being grown by the Czochralski method. These grown-in defects are oxygen precipitates and dislocations induced in the device production process, voids, or stacking faults. However, on the other hand, these aforementioned defects are utilized as gettering sites for heavy metals. As the concentration of the gettering sites decreases, the purity of the silicon wafer is compromised and the concentration of heavy metal impurities exceeds a level of $1\times10^{10}$ atoms/cm$^2$, which is the level required for the most advanced device production. Consequently, since it is necessary to reduce heavy metal impurities existing in a silicon wafer as far as is possible, controlling those defects is an extremely important task.

As one of the technologies for avoiding deterioration of device characteristics caused by voids at the surface of the silicon wafer, the use of epitaxial wafers is known, wherein the wafers are formed by deposition of an epitaxial layer by a CVD method on a surface of a mirror polished silicon substrate wafer obtained from a silicon single crystal. Because of the absence of voids in this epitaxial layer, a semiconductor wafer with good Gate Oxide Integrity can be attained. However, when the deposition of the epitaxial layer is performed, oxygen precipitates (Bulk micro defect: BMD) generated as a result of an oxygen deposit are not formed inside the epitaxial wafer while the silicon wafer is subjected to heat treatment in a device process. If no BMDs are generated, the gettering of heavy metals which contaminate the wafer during the device process cannot be done. Therefore, a problem of the deterioration of device characteristics results.

Accordingly, to solve such problems, T. Abe and H. Takeno, Mat. Res. Soc. Symp. Proc. Vol. 262, 3, 1992, for example, reports that by doping a silicon single crystal with nitrogen, the aggregation of crystal-lattice vacancies in silicon is suppressed, and that the crystal defect density is lowered. JP2000-109396 correlates to the technology described in the above-mentioned report, and proposes a method which comprises deposition of an epitaxial layer on a silicon substrate wafer obtained from a crystal with added nitrogen in order to sufficiently generate BMDs even after the deposition of the epitaxial layer. In this method, because nitrogen becomes a nucleus for the formation of BMDs, and because BMDs are generated even after the deposition of the epitaxial layer, an epitaxial wafer with superior gettering capability in heat treatment in device processing can be attained.

In addition, JP2008-150283 has proposed a method for reducing the number of defects by adding boron and by optimizing the thermal history of pulling and growing a silicon single crystal with a predetermined resistivity through the Czochralski method. Such method can reduce the number of epitaxial defects in the resultant wafers. Also, a higher in-plane uniformity of the density of oxygen precipitates as well as a higher gettering capability can be achieved. However, it has been clarified by recent studies that the thermally stable oxygen precipitates produced by nitrogen doping, which are difficult to eliminate even by heat treatment at high temperatures, cause a problem as they tend to induce defects in the epitaxial layer. Further, when the silicon is doped with boron, the gettering capability becomes lowered for heavy metal impurities unless a high concentration of boron is used.

Therefore, to solve the above problem, for example, JP3589119 has disclosed a technology for controlling the position where an OSF ring is generated depending on the pulling rate by controlling a gap L between the melt surface and the lower end of a thermal shielding material so as to adjust the position of the OSF ring to the pulling rate. Especially, there has been proposed a method for pushing the OSF region out of the crystal by setting the crystal pulling rate to a value equal to or higher than 1.2 mm/minute. It has been reported that, in this method, a density of the epitaxial layer defects can be reduced to a level equal to or lower than 0.1 cm$^{-2}$ (defects per square centimeter) sufficiently suppressing the generation of the epitaxial layer defects.

In addition, as another method of technology to avoid the above-mentioned problem, for example, JP2008-100906 has proposed a method for doping with boron, nitrogen, and hydrogen. It is disclosed that in this method, without increasing the epitaxial layer defects on the epitaxial wafer, the gettering capability and a low density of epitaxial layer defects can be achieved by using hydrogen which weakens the effect of nitrogen in promoting the formation of oxygen-induced stacking faults.

Further, JP2000-281491 has proposed a method for growing a silicon single crystal by introducing hydrogen gas and incorporating nitrogen in the silicon melt at levels ranging from $1\times10^{16}$ to $1.5\times10^{19}$ cm$^{-3}$ (atoms per cubic centimeter). Through this method, the generation of octahedron-like vacancy defects is suppressed to lower the size of the vacancy defects and to reduce the density of the oxygen precipitates in the single crystal.

However, as in JP2000-109396, when the silicon substrate wafer with added nitrogen is used as an epitaxial wafer substrate, nitrogen causes defects in the epitaxial layer. In addition, these nitrogen-induced defects in the epitaxial layer have been known to appear in the defect region called an OSF region of a nitrogen-doped substrate. One reason is that oxygen precipitates already existing in the OSF region at the stage just after crystal growth form new defects in the epitaxial layer. It should be noted that the term "OSF region", as used herein, refers to a region where the concentration of the crystal lattice vacancies is extremely lowered because the crystal lattice vacancies and the interstitial silicon atoms recombine due to radial diffusion. Also, this is the region in which an oxidation heat treatment of the silicon wafer generates oxidation-induced stacking faults.

Doping the silicon wafer with boron at a high concentration, as in JP2008-150283 or JP2008-100906, causes a problem in that the boron impurities in the substrate diffuse out into the vapour phase during the deposition of the epitaxial layer and get incorporated into the epitaxial layer again. This phenomenon is called auto-doping. On the other hand, a silicon single crystal wafer doped with a low concentration of boron cannot solve the problem of the lower gettering capability for heavy metal impurities in segregation-type gettering by boron atoms, compared to the relaxation-type gettering using oxygen precipitates.

Further, as described in JP3589119, when the crystal size becomes equal to or larger than 300 mm, it is difficult to stably grow a crystal with a pulling rate equal to or higher than 1.2 mm/minute. In addition, it has been noted clearly that when an epitaxial layer is deposited after producing a silicon substrate wafer under such conditions as described in JP2000-281491, the epitaxial layer generates defects even when a substrate with no OSF region is used. It has been clarified that such epitaxial layer defect are generated from voids at the substrate surface (FIG. 1). As shown in FIG. 1, it has been confirmed that by doping the silicon crystal with nitrogen and hydrogen, voids are generated in the silicon crystal. Those voids which are located in the vicinity of the substrate surface before depositing the epitaxial layer may cause dislocations in the epitaxial layer. The dislocations are formed in the epitaxial layer at the surface of the substrate with the voids as an originating point.

SUMMARY OF THE INVENTION

Accordingly, an object of the present invention is to suppress and prevent epitaxial layer defects generated from voids in the silicon substrate wafer occurring when the silicon crystal is doped with nitrogen and hydrogen. These and other objects are surprisingly and unexpectedly a method for producing an epitaxial wafer comprising:
  a step of growing a silicon crystal by the Czochralski method comprising adding hydrogen and nitrogen to a silicon melt and growing from the silicon melt a silicon crystal having a nitrogen concentration of from $3 \times 10^{13}$ cm$^{-3}$ to $3 \times 10^{14}$ cm$^{-3}$,
  a step of preparing a silicon substrate by machining said silicon crystal, and
  a step of forming an epitaxial layer at the surface of the silicon substrate.

BRIEF DESCRIPTION OF THE DRAWINGS

FIG. 4 is a photograph taken by a transmission electron microscope showing a bubble-like void aggregate in a silicon wafer.

FIG. 6 is a drawing showing the relationship between the nitrogen concentration as well as V/G and the epitaxial layer defects induced in an epitaxial wafer using a substrate with hydrogen and nitrogen added by the method of the present invention.

FIG. 7 is a drawing showing the conditions of the epitaxial layer defect generation in terms of the amount of the added nitrogen and hydrogen.

DETAILED DESCRIPTION OF THE PREFERRED EMBODIMENT(S)

By the production method of the present invention, the epitaxial layer defects generated from hydrogen defects (voids) which are induced by adding hydrogen can be suppressed and prevented, and the number of bubble-like void aggregates which are a form of defect induced by adding hydrogen can be controlled. Also, the epitaxial layer defects induced by the bubble-like void aggregates can be suppressed and prevented.

A first aspect of the present invention is to provide a method for the production of a semiconductor wafer, which comprises the following steps: A step of adding hydrogen and nitrogen to a silicon melt and growing a silicon crystal having a nitrogen concentration ranging from $3 \times 10^{13}$ atoms/cm$^3$ to $3 \times 10^{14}$ cm$^{-3}$ (atoms per cubic centimeter) by the Czochralski method (step 1), a step of machining the silicon crystal to prepare a silicon substrate (step 2), and a step of forming an epitaxial layer on the surface of the silicon substrate (step 3).

By this method, the epitaxial layer defects generated from voids on the surface of a substrate with added hydrogen when an epitaxial layer is deposited on such a substrate can be suppressed and prevented.

In general, the state of crystal defects varies depending on conditions such as the presence or absence of a doping of nitrogen or hydrogen, the pulling rate, or the parameter values of V/G. The influence of those conditions on the generation of crystal defects will be explained with reference to FIG. 2.

Figure 2:
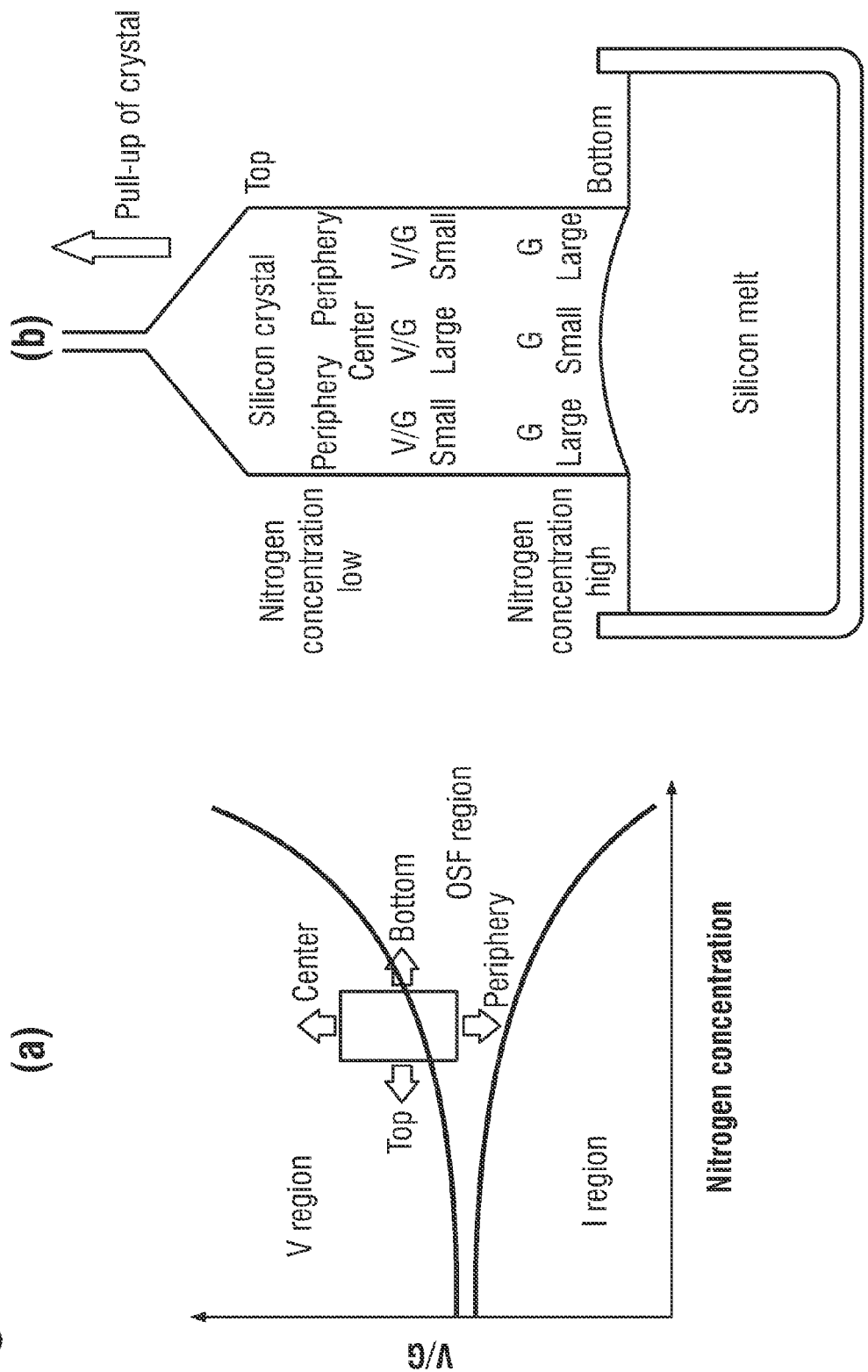
FIG. 2 is a drawing explaining the relationship between the defect regions and the nitrogen concentration in a silicon ingot grown by the Czochralski method. (a) is a graph showing the relationship between the defect regions and the nitrogen concentration in a substrate before the epitaxial deposition. (b) is a schematic drawing showing the defect regions and the nitrogen concentration distribution in a silicon crystal ingot during pulling.

FIG. 2 is a drawing explaining the relationship between the defect regions and the nitrogen concentration in a silicon ingot grown by the Czochralski (CZ) method. (a) is a graph showing the relationship between the defect regions and the nitrogen concentration in a substrate before the epitaxial deposition. (b) is a schematic drawing showing V/G and the nitrogen concentration distribution in a silicon crystal ingot during crystal growth.

In the CZ method, as is well known, an ingot of a silicon single crystal is grown while pulling the growing ingot gradually upward from a silicon melt. In a wafer substrate cut from this ingot, three kinds of defect regions (V region, OSF region, and I region) exist as shown in FIG. 2 (a).

First, the V region is a region where an excess of crystal-lattice vacancies is introduced from the solid-liquid interface during crystal growth. There exist voids created by the aggregation of the crystal-lattice vacancies. These voids are also known as "COPs" (crystal originated particles).

The OSF region is a region where OSFs are generated when the silicon single crystal wafer is subjected to an oxidation heat treatment. It should be noted that an OSF as referred to herein is a disk-like stacking fault with a diameter of about several microns, where an oxygen precipitate (the OSF nucleus) exists at the centre. The OSF can be formed by the aggregation of the interstitial silicon atoms, which are generated from the interface between an oxidized film and a silicon substrate around the OSF nucleus. The OSF nucleus is a particular oxygen precipitate having a property to collect the interstitial silicon atoms and is considered to already exist at the substrate at the stage just after the crystal growth. Because the OSF nucleus has a small size (it is considered to be equal to or smaller than 10 nm), it cannot be detected by present evaluation methods such as a particle counter or an infrared tomograph. Therefore, the presence of OSFs can be confirmed first by performing an oxidation heat treatment.

The I region is a region where excess interstitial silicon atoms are introduced from the solid-liquid interface during the crystal growth. There exist dislocation loops created by the aggregation of the interstitial silicon atoms.

For example, according to conventional knowledge as published in V. V. Voronkov, K. Crystal Growth, 59 (1982) 625 or M. Iida, W. Kusaki, M. Tamatsuka, E. Iino, M. Kimura and S. Muraoka, Defects in Silicon. T. Abe, W. M. Bullisetal (ECS., Pennington N.J., 1999) 499), it has been known that the defect regions of the substrate are determined by the nitrogen concentration and the crystal growth condition of V/G (wherein V is a pulling rate [mm/minute]; and G is an average temperature gradient [° C./mm] in a crystal growth axis direction from the melting point down to 1350° C.).

In a silicon single crystal with no added nitrogen, crystal lattice vacancies are introduced excessively to form a V region in a silicon substrate sawn there from when V/G becomes larger than a specific value. In contrast, when V/G becomes smaller than a specific value, interstitial silicon atoms are introduced excessively to form an I region in the silicon substrate. On the other hand, nitrogen influences the quantity of the crystal-lattice vacancies and the interstitial silicon atoms introduced from the solid-liquid interface. Therefore, the defect regions of a silicon substrate cut out of the silicon single crystal with added nitrogen can be represented, as shown in FIG. 2(a), by a two dimensional defect region map with the nitrogen concentration and V/G as the two axes.

In addition, one piece of ingot of a crystal with added nitrogen has, as shown in FIG. 2(a), a certain width in the nitrogen concentration and V/G and is shown by a rectangular region (called a growth condition region) in the nitrogen concentration-V/G drawing. This is because, as shown in FIG. 2(b), an ingot of a crystal with added nitrogen has a higher nitrogen concentration at the lower part and has a lower V/G value at the crystal periphery compared to the centre part.

The nitrogen addition to the CZ-silicon single crystal is performed by using a melt with added nitrogen. However, it has been known that the ratio (the segregation coefficient) of the nitrogen concentration incorporated from the melt into the crystal in the solidification process is very small. Therefore, most of the nitrogen in the melt remains in the melt, and the nitrogen concentration in the melt is increased as the crystal growth proceeds. As a result, the nitrogen concentration becomes higher at the lower part of the crystal. In addition, the average temperature gradient G [° C./mm] in a crystal growth axis direction from the melting point down to 1350° C. depends on the crystal cooling capability. However, because the crystal periphery is in general easily cooled, G is larger at the crystal periphery. As a result, V/G becomes lower at the crystal periphery.

By overlapping a range of growth conditions of one piece of a crystal ingot with nitrogen added over the two-dimensional defect region map which uses the nitrogen concentration and V/G as two axes, the defect regions of the crystal can be described. For example, in a crystal within a growth condition range as shown in FIG. 2, the V region can be found at the crystal centre while the OSF region can be found at the crystal periphery. When V/G is increased with the nitrogen concentration range fixed, the V region extends over the whole substrate surface. When V/G is decreased, the V region becomes shrunk at the substrate centre, and the I region extends over the whole substrate surface. In addition, when the nitrogen concentration is increased with V/G fixed, the OSF region is generated from the periphery and spreads over the whole substrate surface.

Figure 3:
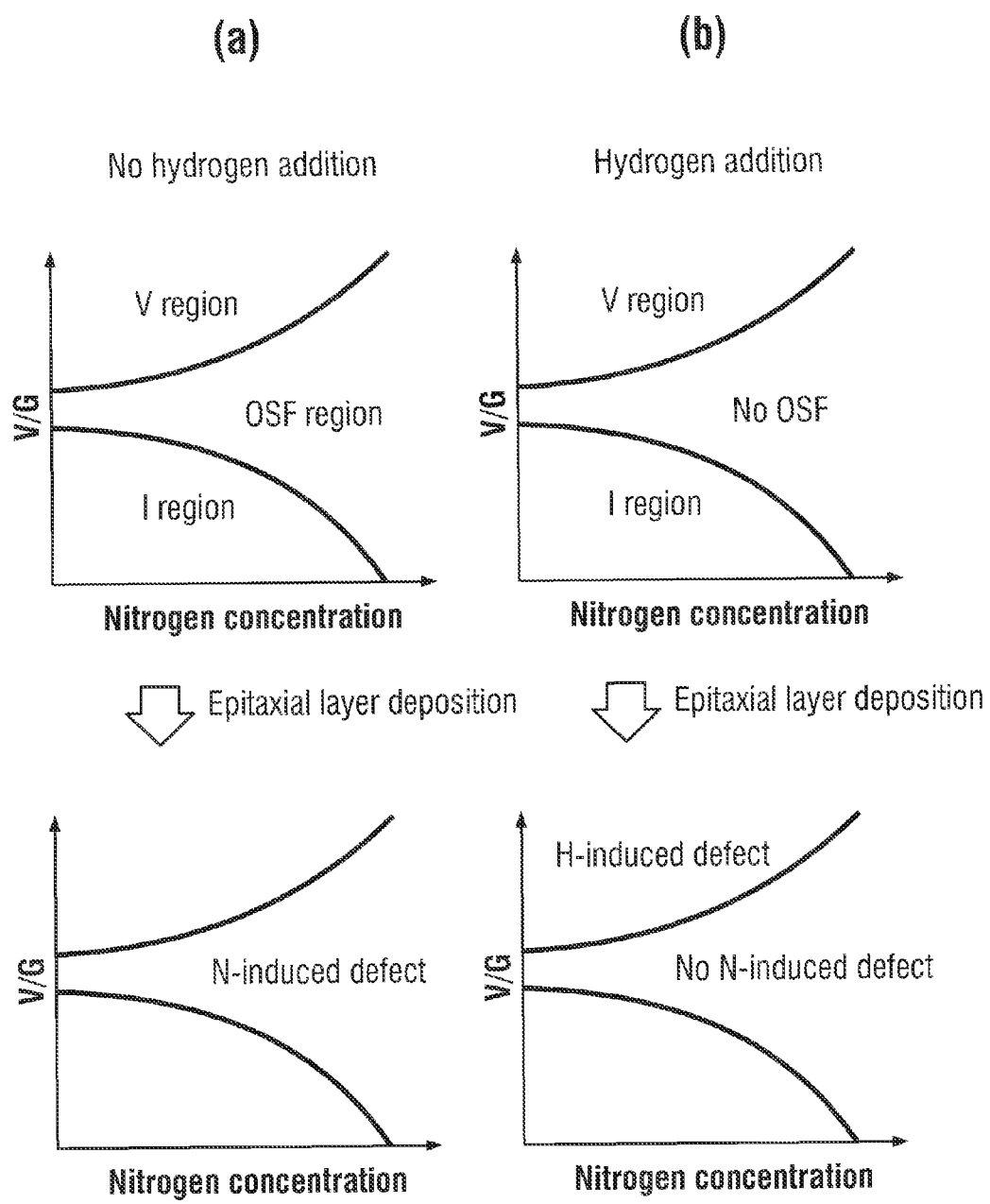
FIG. 3 is a schematic drawing showing the defect regions and the presence or absence of epitaxial layer defects.

As a result of the detailed investigation on the relationship between the epitaxial layer defects generated in the epitaxial wafer using a nitrogen-doped substrate with such defect regions, the nitrogen concentration and V/G, it has been found that the defect regions after the epitaxial deposition appear as shown in FIG. 3.

First, when a substrate with added nitrogen but without hydrogen is used, the epitaxial layer defects are generated at locations corresponding to the OSF region of the substrate. This defect is called an N-induced defect. It is considered that this defect is generated by a new defect formed in the epitaxial layer due to a particular oxygen precipitate already existing at the stage just after crystal growth in the OSF region.

Then, when a silicon substrate with hydrogen as well added as nitrogen is used, OSFs are not generated in a region corresponding to the OSF region of the substrate with added nitrogen. The N-induced defects are not generated as well. It is supposed that this is because hydrogen renders harmless the existing particular oxygen precipitates in the OSF region. On the other hand, in the case of the silicon substrate with added hydrogen, it has been confirmed that a new epitaxial layer defect different from the N-induced defect is generated in a region corresponding to the V region of the substrate This defect is called an H-induced defect. Therefore, when the epitaxial wafer is produced by using the silicon substrate with hydrogen and nitrogen added, it is necessary to take countermeasures to prevent the generation of the H-induced defect.

Accordingly, it will be confirmed by the examples to be described later, that in the silicon wafer and the production method thereof according to the present invention, the epitaxial layer defects induced by the addition of hydrogen can be suppressed and prevented by adding nitrogen and hydrogen as well as by setting the hydrogen partial pressure to a proper range.

In producing the silicon wafer according to the present invention, it has been confirmed by the present inventors that by growing the silicon crystal under the predetermined conditions with hydrogen and nitrogen added, the shapes of the voids in the V region vary. That is, the form of the voids changes from an octahedron to a bubble-like void aggregate (see FIG. 4). In addition, it is considered that the bubble-like void aggregates cause the H-induced defects which are generated in the epitaxial layer.

That is, as a result of an intensive study, the present inventors have been able to observe the silicon crystal (silicon wafer) relevant to the present invention by using a transmission electron microscope (TEM, JEM-2010, manufactured by JEOL Ltd.). The observation direction was the 110 direction. The diffraction condition was set to the two-wave condition which the 220 reflection excites. When the deviation quantity S from the Bragg condition was set larger than 1 g, the above bubble-like void aggregates were found. An influence of the bubble-like void aggregates on the epitaxial layer was found when the epitaxial layer was formed on a silicon wafer having the bubble-like void aggregates. An explanation of the bubble-like void aggregate in comparison to a conventional void will be given below.

Figure 5:
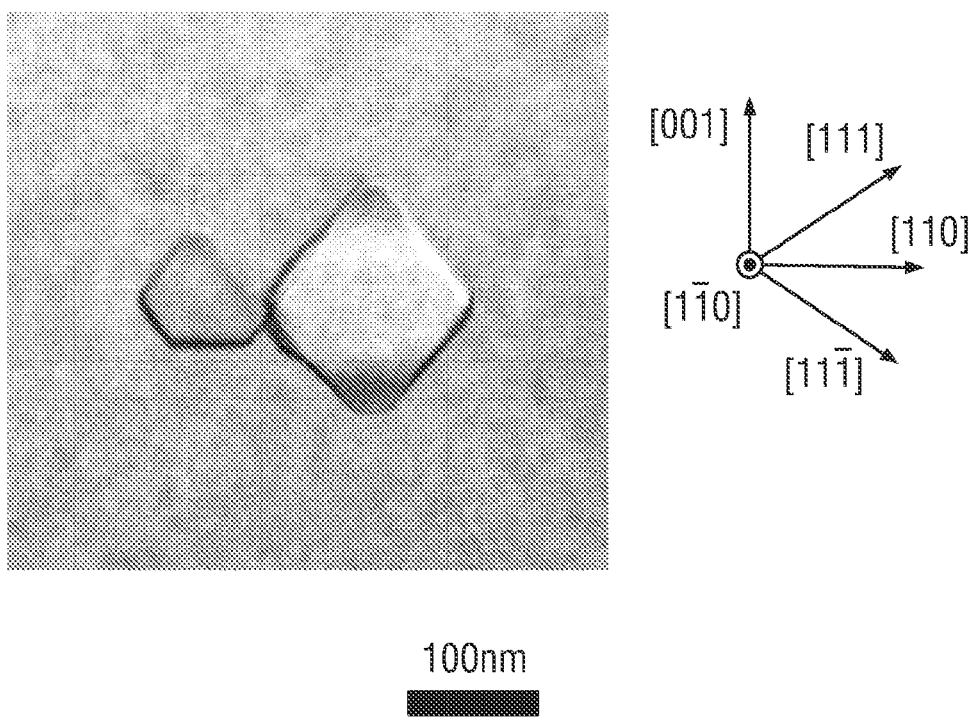
FIG. 5 is a photograph taken by a transmission electron microscope showing a void in a silicon wafer.

It has been noted clearly that the shape of voids existing in the V region of a conventional silicon crystal is an octahedron having {111} surfaces as shown in FIG. 5. In the silicon single crystal having a crystal diameter of equal to or larger than 200 mm produced by the Czochralski method, the size of the octahedral voids is about 100 to 300 nm. Upon deposition of the epitaxial layer, no epitaxial layer defects are generated in the V region where such octahedron-like voids exist.

Figure 1:
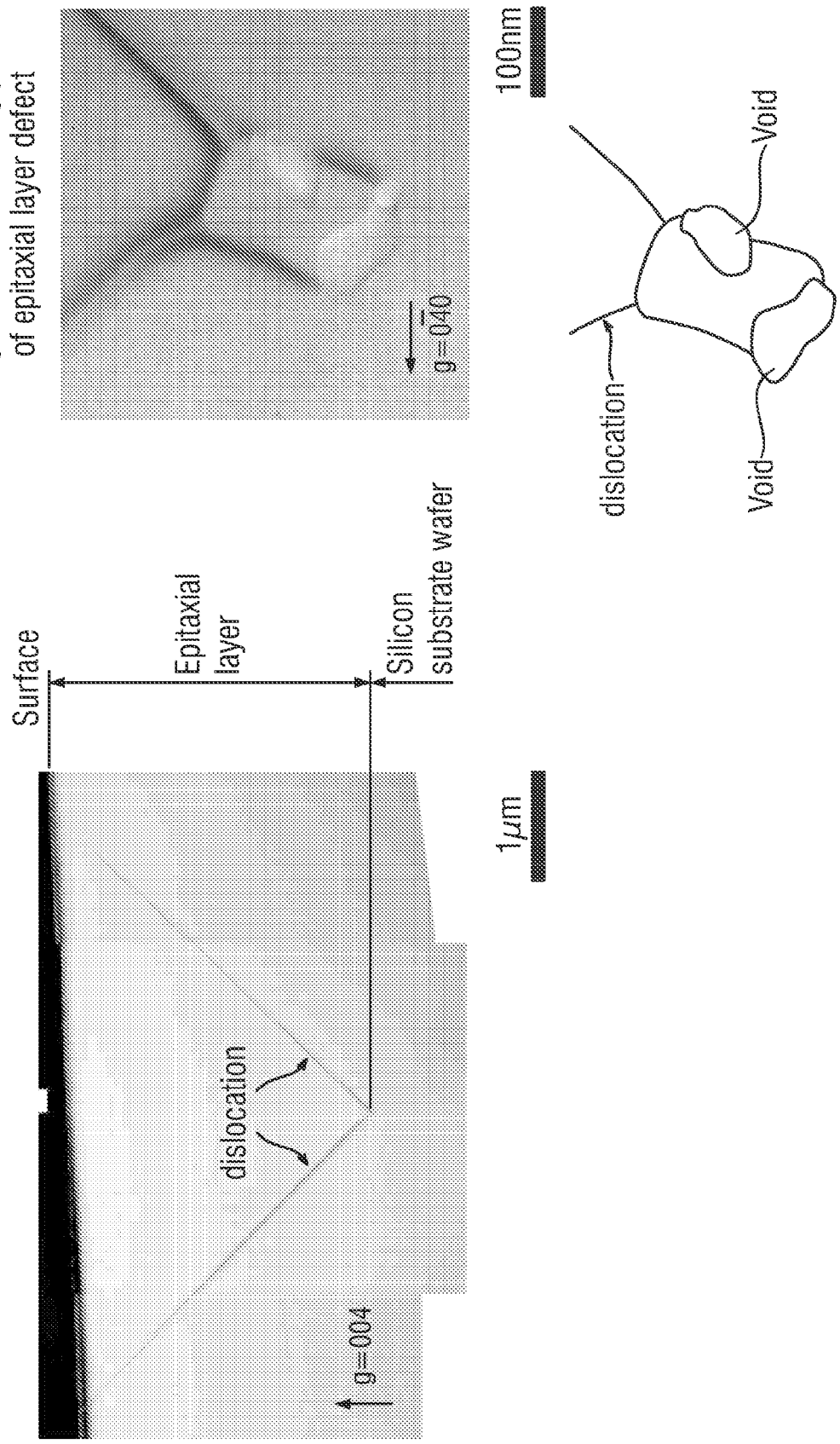
FIG. 1 is a photograph showing the appearance of an epitaxial layer defect induced by adding hydrogen.

On the other hand, FIG. 4 is a photograph taken by a transmission electron microscope showing a bubble-like void aggregate existing in a silicon crystal in the present invention. The term "bubble-like" means an aggregate of a plurality of irregularly shaped voids which have neither an octahedral shape nor {111} surfaces as shown in FIG. 4. Therefore, a void aggregate seen specifically in the silicon wafer (silicon crystal) according to the present invention is called a "bubble-like void aggregate". The present inventors have found that, when an epitaxial layer is deposited on a substrate containing many such bubble-like void aggregates, H-induced defects are generated in a large quantity in the epitaxial layer. The reason why the bubble-like void aggregates as shown in FIG. 4 induce the generation of H-induced defects as shown in FIG. 1 has not been clarified yet at the present stage. However, it is estimated that small voids dissolve in the grown silicon crystal, leaving relatively large voids. As a result, a vacancy appears, and, the vacancies agglomerate and form a vacancy type dislocation loop. Such dislocation loops are then transcribed onto the epitaxial layer, and two dislocations (H-induced defects) are formed in the epitaxial layer.

As an allowable quantity for the number of epitaxial layer defects, it would not be a problem as far as the device characteristics is concerned if the number of such defects is lower than an embodiment with the smallest number of such defects (0.04 cm$^{-2}$ [defects per square centimeter], that is 28 defects/wafer for a 300 mm wafer) described in JP3589119 for example. According to the knowledge of the present inventors, it has been confirmed that epitaxial layer defects can be kept at the above-mentioned level by maintaining the ratio of the bubble-like void aggregates equal to or less than 0.4. It should be noted that the "ratio of the bubble-like void aggregates" according to the present invention means a ratio of the bubble-like void aggregates to the total void number, which is set to 1. The "total void number" means the total number of voids contained in the bubble-like void aggregates as well as other voids not contained in the aggregates.

Therefore, regarding the voids existing in the silicon substrate obtained from the silicon crystal according to the present invention, the number of the bubble-like void aggregates having a plurality of irregular voids aggregated is preferably below 0.4 relative to the total number of voids. Below 0.3 relative to the total number of voids is more preferable. In this way, the number of bubble-like void aggregates, which are one kind of hydrogen defect induced by the addition of hydrogen, can be controlled. Thus, the epitaxial layer defects induced by the bubble-like void aggregates can be suppressed and prevented.

In addition, it has been confirmed that in a silicon crystal grown by adding only nitrogen to a silicon melt, no bubble-like void aggregates are formed. When nitrogen and hydrogen are added, the ratio of bubble-like void aggregates increases proportionally to the added hydrogen concentration. Further, it has been confirmed that for a silicon crystal grown by adding nitrogen and hydrogen to the silicon melt, the ratio of bubble-like void aggregates increases in spite of the increase in the nitrogen concentration. In addition, the increase in the cooling rate during the silicon crystal growth decreases the ratio of the bubble-like void aggregates. Further, it is considered that a vacancy-hydrogen composite or an interstitial silicon-hydrogen composite can be formed by a reaction of hydrogen in the silicon crystal with the vacancies or interstitial silicon atoms existing in excess. Thus, the number of vacancies or interstitial silicon atoms is decreased, which allows growing a silicon crystal with a smaller number of COPs or dislocation loops or a small defect size. Accordingly, it is considered that if the hydrogen concentration added to the silicon melt is lowered, the amount by which the vacancies or the interstitial silicon atoms existing in excess in the silicon crystal can be rendered harmless decreases as well. Thus, the defect density in the silicon crystal cannot be suppressed.

Therefore, for example, as in embodiment 1 in paragraph [0048], or embodiment 2 in paragraph [0055] of the above-cited JP-2000-281491, under the condition in which the hydrogen volume ratio in the atmosphere during growth of the silicon single crystal is decreased to 50 ppm ($5 \times 10^{-3}$%) or 0.1 ppm ($1 \times 10^{-5}$%) while maintaining a high nitrogen concentration atmosphere as high as $10^{16}$ to $10^{19}$, the generation of crystal defects such as OSFs cannot be suppressed for the above reason. Therefore, defects remain in an epitaxial layer after the deposition thereof. In addition, it is understood that by increasing the hydrogen volume ratio of the atmosphere during the growth of the silicon single crystal to as high as 4% under a high nitrogen concentration of the atmosphere as described in paragraph [0056] of the Literature, the ratio of bubble-like void aggregates increases. Thus, the epitaxial layer defects cannot be suppressed and prevented.

Therefore, it is considered that the number of bubble-like void aggregates can be controlled by controlling such conditions within specified ranges, as the nitrogen concentration in the silicon single crystal and the hydrogen partial pressure in growing the crystal, the cooling rate and pulling rate.

FIG. 6 is a schematic drawing showing the relationship between the epitaxial layer defects generated in an epitaxial wafer and the nitrogen concentration and V/G, wherein the above epitaxial wafer was derived from a substrate with hydrogen and nitrogen added, produced by the production method of the present invention. The H-induced defects in the V region and the N-induced defects in the region corresponding to the OSF region at the substrate with only nitrogen added are both suppressed. In the production method of the present invention, because it is not necessary to control a defect region of the substrate by controlling V/G to avoid the epitaxial layer defect, it is advantageous that an allowable range for the crystal production condition can be broadened.

FIG. 7 shows a part of the experimental results achieved by the present inventors. As shown in FIG. 7(a), it can be confirmed that in the silicon crystal grown by the addition of nitrogen, the OSF ring caused by the addition of nitrogen is formed as can be understood from FIG. 3(a). By doping with hydrogen under such conditions, a change occurs as shown in FIG. 3(b). It can be confirmed that the OSF ring derived from the nitrogen addition does not appear (see FIG. 7(b)).

Therefore, it has been confirmed that, by the addition of nitrogen and hydrogen, although the generation of oxygen precipitates etc. as a result of the nitrogen addition as one cause of the epitaxial layer defects can be controlled by hydrogen doping, defects derived from hydrogen are generated as shown by FIG. 7(b). However, it can be understood that by adding nitrogen and hydrogen in a predetermined range and by setting predetermined conditions (cooling rate or the like), as in the production method of the present invention, the bubble-like void aggregates found by the present inventors can be controlled. Also, the epitaxial layer defects (H-induced defects) generated from the bubble-like void aggregates can be suppressed and prevented as shown in FIG. 7(c). In addition, it is considered that the bubble-like void aggregate found by the present inventors is not a huge cavity formed by the aggregation of hydrogen but rather is an object morphologically changed from the void defect formed by the aggregation of crystal-lattice vacancies due to hydrogen addition.

The production method for the epitaxial wafers according to the present invention will be explained below, step by step.

Step 1

The production method of the epitaxial wafer according to the present invention comprises a step of adding hydrogen and nitrogen to a silicon melt and then growing a silicon crystal having a nitrogen concentration ranging from $3\times10^{13}$ $cm^{-3}$ to $3\times10^{14}$ $cm^{-3}$ by the Czochralski method.

The method for adding nitrogen into the silicon melt according to the present invention is not specifically limited, and any known method can be used. For example, it is possible to introduce nitrogen gas during the melting of the silicon raw material or to add a silicon substrate on which a nitride was deposited by a CVD method or the like before melting the silicon raw material.

The nitrogen concentration in the silicon crystal according to the present invention is preferably from $3\times10^{13}$ $cm^{-3}$ to $3\times10^{14}$ $cm^{-3}$, and more, preferably from $5\times10^{13}$ $cm^{-3}$ to $2\times10^{14}$ $cm^{-3}$.

If the nitrogen concentration in the crystal is below $3\times10^{13}$ $cm^{-3}$, the BMD density would become less than $2\times10^{8}$ $cm^{-3}$. As a result, a sufficient gettering capability cannot be achieved. On the other hand, if the nitrogen concentration is over $3\times10^{14}$ $cm^{-3}$, the ratio of bubble-like void aggregates would become greater than 0.4. As a result, the epitaxial layer defects induced by the hydrogen addition would be generated.

The method for adding hydrogen to the silicon melt in the process of growing the silicon crystal according to the present invention preferably comprises a step of pulling the silicon single crystal under an atmosphere with a hydrogen partial pressure ranging from 0.1 mbar to 0.4 mbar, or more preferably from 0.2 mbar to 0.35 mbar.

If the hydrogen partial pressure is below 0.1 mbar, the epitaxial layer defect induced by nitrogen would not be suppressed. If the hydrogen partial pressure is over 0.4 mbar, the ratio of bubble-like void aggregates would become greater than 0.4. As a result, the epitaxial layer defects induced by the hydrogen addition would be generated.

The quantity of hydrogen to be introduced into a crystal growing furnace in the production method according to the present invention is determined such that the volume ratio thereof (volume of hydrogen/volume of total mixed gas to be introduced) is 0.3% to 1.0%, or more preferably 0.5% to 0.9%.

A volume ratio of hydrogen in the atmosphere of the furnace of over 1.0% is not preferable because of its explosion risk. On the other hand, with a volume ratio of below 0.3%, it is difficult to incorporate hydrogen in the silicon single crystal.

Hydrogen to be introduced into the crystal growing furnace in the production method according to the present invention may be a mixture of hydrogen with an inert gas or the like. For the inert gas, the inexpensive Ar gas is preferable, but various kinds of rare gases such as He, Ne, Kr or Xe can be used singly or alternatively as a mixed gas.

The method for adding boron to the silicon melt according to the present invention is not specifically limited, and any known method can be used. For example, it is possible to introduce boron during the melting of the silicon raw material, to add a silicon substrate on which a boron-containing compound or the like was deposited by a CVD method or the like during the melting of the silicon raw material, or to charge boron as an element into the silicon melt.

The pulling rate V [mm/minute] according to the method of the present invention is not specifically limited. However, in terms of productivity, it is preferable to be equal to or higher than 0.8 mm/minute.

In the step of growing the silicon crystal according to the present invention, the cooling rate of the silicon single crystal at 1100 to 1200° C. is preferably set equal to or higher than 3.5° C./minute. More preferably, the cooling rate of the silicon single crystal at 1100 to 1150° C. is set equal to or higher than 3.5° C./minute.

If the cooling rate at 1200 to 1100° C. during the crystal growth is below 3.5° C./minute, the ratio of bubble-like void aggregates would become over 0.4. As a result, the epitaxial layer defects induced by the hydrogen addition would be generated. Because the upper limit of the cooling rate varies depending on the diameter of the silicon single crystal to be grown, it is not specifically limited. However, in particular, a large crystal diameter equal to or larger than 300 mm is difficult to attain with a cooling rate equal to or higher than 4.5° C./minute.

In addition, because the aggregation of crystal-lattice vacancies resulting in the formation of voids does not occur over 1200° C. while the crystal is being cooled, there are no effects on the ratio of the bubble-like void aggregates even by adjusting the cooling rate in this temperature range.

Further, because the void formation reaction is already completed, there are no effects on the ratio of bubble-like void aggregates below 1100° C. while the crystal is being cooled even by adjusting cooling rate in this temperature range.

As described above, in the present invention a crystal heating apparatus and a crystal cooling apparatus can be used in the crystal growth using the Czochralski method in order to set the cooling rate during silicon crystal growth within a predetermined range. The apparatus for the production of the silicon crystal which can be used in the production method according to the present invention is not specifically limited. However, in order to increase the crystal cooling rate at 1100 to 1200° C. during crystal growth, a special treatment such as increasing the cooling capability of a thermal shielding plate to be installed so as to surround the crystal may become necessary as described in JP2004-224642 for example.

Step 2

The method of producing an epitaxial wafer according to the present invention includes a step of preparing a silicon substrate machining said silicon crystal.

A silicon substrate wafer is usually produced from the silicon crystal ingot prepared by the above-mentioned production method, by such steps as slicing the silicon crystal using a wire saw or an internal-diameter saw, and subjecting the sliced wafers to chamfering, planarization (including e.g. grinding or lapping), etching, and polishing (including stock-removal and mirror polishing). However, it should not be specifically limited thereto.

Step 3

The method of producing an epitaxial wafer according to the present invention includes a step of forming an epitaxial layer at the surface of this silicon substrate.

In step 3, the single crystal silicon is subjected to the epitaxial growth onto the surface of the front surface part of the silicon substrate wafer using a CVD apparatus (for example, an epitaxial growth apparatus manufactured by Applied Materials Co., Ltd., or ASM Co., Ltd.). In this way, the epitaxial layer with a desired film thickness for the desired semiconductor device can be formed, and the silicon substrate wafer according to the present invention can be attained.

A second aspect of the present invention is to provide an epitaxial wafer having an epitaxial layer formed at the surface of a silicon substrate wafer which comprises a nitrogen concentration ranging from $3\times10^{13}$ cm$^{-3}$ to $3\times10^{14}$ cm$^{-3}$. Also, the number of bubble-like void aggregates having a plurality of irregular voids aggregated is below 0.4 relative to the total number of voids existing in said silicon substrate.

It is considered that the production method of the present invention controls such conditions within specified ranges as the nitrogen concentration in the silicon single crystal and the hydrogen partial pressure during crystal growth, the cooling rate, and the pulling rate. Thus, the epitaxial wafer obtained by this production method has less epitaxial layer defects which are generated from the hydrogen defects (voids) induced by the hydrogen addition.

Further, according to the production method of the present invention, since the conditions, including the nitrogen concentration in the silicon single crystal, the hydrogen partial pressure during growth of the crystal, the cooling rate, and the pulling rate are all found to be controlled within a specified range, the epitaxial wafer obtained by this production method generates a limited number of bubble-like void aggregates. Also, the number of bubble-like void aggregates as one kind of hydrogen defects induced by the addition of hydrogen is kept below 0.4 relative to the total void number. Thus, the epitaxial layer defect induced by the bubble-like void aggregate can be reduced.

EXAMPLES

The present invention will be explained below with reference to Examples and Comparative Examples. It should be noted that the present invention is not limited to the above embodiments and the following examples. They are exemplary only. As long as any of those having substantially the same configuration as the technical idea described in the claims of the present invention and those having the similar function effect, they are considered to be within the technical range of the present invention.

1. Production of the Silicon Substrate Wafer

In each of the present Examples and Comparative Examples, an apparatus for the production of a silicon single crystal by the usual Czochralski method is used. A first puller having a general cooling rate and a second puller, wherein a thermal shielding plate is cooled by a special method to increase the cooling rate at 1100 to 1200° C., were used. It should be noted that, in performing the present invention, the puller is not specifically limited as long as it is capable of performing the growth condition of the present invention.

Nitrogen was added by putting a wafer having a nitride film into the silicon melt so as to set the concentration of nitrogen in the silicon single crystal to $1.8\times10^{14}$ cm$^{-3}$. In addition, hydrogen was added by introducing a mixed gas containing hydrogen into each of the pullers. It should be noted that the hydrogen partial pressure (mbar) in the puller was set to the condition described in the following Table 1.

The cooling rate of the crystal at 1100 to 1200° C. during growing the crystal in the first puller was set to 2.5° C./minute, and the cooling rate in the second puller was set to 3.8° C./minute. The cooling rates of the temperature in each Example and each Comparative Example are described in Table 1 below.

The silicon crystal grown by utilizing this apparatus had a conduction-type of p-type and a crystal size (diameter) of 300 mm (12 inches).

The resistivity of the silicon single crystal was from 10 to 15 Ωcm. The pulling rate in any case was below 1.2 mm/minute.

The nitrogen concentration, the cooling rate, and the hydrogen partial pressure applied in the Examples and Comparative Examples are specified in Table 1 below.

2. Measurement of the Nitrogen Concentration in the Silicon Substrate Wafer

The nitrogen concentration of the silicon substrate wafer obtained by slicing the crystal grown by the above method was measured by using secondary ion mass spectrometry (SIMS). However, because a wafer having a nitrogen concentration equal to or lower than $5\times10^{14}$ cm$^{-3}$ cannot be measured by using SIMS, the nitrogen concentration determined by the following equation was used. This equation will be explained in detail below.

The nitrogen concentration incorporated into the crystal from a silicon melt used in the production method of the present invention can be calculated by the following Equation 1:

$$\text{Nitrogen concentration in the wafer} = k \times (1-\text{solidification ratio})^{(k-1)} \times (\text{nitrogen concentration in the melt})$$

It should be noted that the nitrogen concentration in the melt may also be referred to as the initial melt nitrogen concentration. Here, the solidification ratio (g) of the silicon crystal can be determined by Equation 2:

$$\text{Solidification ratio}(g) \text{ of the silicon crystal} = (\text{Weight of crystallized silicon})/(\text{Weight of initial melt})$$

In addition, it has been known that the segregation coefficient k, which is the ratio of the impurities incorporated into the crystal after the solidification of silicon melt to the concentration in the melt, is $7\times10^{-4}$ in the case of nitrogen (W. Zulehner and D. Huber, Crystal Growth, Properties and Applications, p. 28, Springer-Verlag, New York, 1982). The measurement value of the nitrogen concentration (in atoms per cubic centimeter) is shown in the following Table.

3. OSF Evaluation of Silicon Substrate Wafer

The OSF evaluation of the substrate obtained by slicing the crystal grown by the above method was performed by the following method. First, the silicon substrate wafer was oxidized at 1100° C. for 1 hour in an oxygen atmosphere containing steam. Then, the oxidized film was removed with hydrofluoric acid, and then the epitaxial layer in a thickness of 1.5 μm was etched with a Wright etching solution. Then the ellipse-like, half-moon-like or bar-like OSF pits generated at the surface were observed with an optical microscope. An OSF surface density (in defects per square centimeter) was determined as OSF pit number per observation area by counting the number of the OSF pits while scanning the wafer in the wafer diameter direction with a view field of a diameter of 2.5 mm using an optical microscope. An area having an OSF surface density of equal to or higher than 100 cm$^{-2}$ was defined as an OSF region. The inner diameter and outer diameter [cm] of the OSF region, determined in this way, are described in the following Table 1.

As for the ratio of the number of bubble-like void aggregates relative to the total void number in the substrate, a value determined by the above method is described in the following Table.

4. Production of the Epitaxial Wafer and Evaluation Thereof

An epitaxial wafer was produced by slicing the silicon crystal grown by the above method, mirror-finishing this substrate wafer and depositing a silicon single crystal layer (the epitaxial layer) by the epitaxial method on the substrate wafer.

5. BMD Measurement of the Epitaxial Wafer

The BMDs of the epitaxial wafer were measured by the following method. First, the epitaxial wafer prepared by the above method was subjected to a heat treatment at 1000° C. for 16 hours, and thereafter the BMD density was measured with a BMD analyzer (MO-4) manufactured by Raytex Corp.

6. Measurement of the Epitaxial Layer Defects of the Epitaxial Wafer

The epitaxial layer defects of the epitaxial wafer were measured by the following method. First, the epitaxial wafer was measured with the particle counter SP-1 manufactured by KLA-Tencor Corp. to identify the positions of LPDs (light point defects) equal to or larger than 0.09 μm. After that, the LPD positions were measured with AFM to identify the LPD as an epitaxial layer defect other than foreign substances adhered to the surface. Among the epitaxial layer defects identified, the epitaxial layer defects generated at the position corresponding to the OSF region of the substrate were defined as N-induced defects, while the epitaxial layer defects generated inside from the OSF region were defined as H-induced defects. The number of the H-induced defects and the N-induced defects determined in this way are described in Table 1.

various changes may be made without departing from the spirit and scope of the invention.

What is claimed is:

1. A method for producing an epitaxial wafer comprising the following steps:
   growing a silicon crystal by the Czochralski method comprising adding hydrogen and nitrogen to a silicon melt and growing from the silicon melt a silicon crystal having a nitrogen concentration of from $3\times10^{13}$ cm$^{-3}$ to $3\times10^{14}$ cm$^{-3}$, wherein the hydrogen is added to said silicon melt by growing said silicon crystal under an atmosphere with a hydrogen partial pressure of from 0.1 mbar to 0.4 mbar and wherein the cooling rate of said silicon crystal at 1100 to 1200° C. is equal to or higher than 3.5° C./minute,
   preparing a silicon substrate by machining the silicon crystal, and
   forming an epitaxial layer at the surface of the silicon substrate.

2. The method of claim 1, wherein the number of bubble-like void aggregates having a plurality of irregular voids aggregated relative to the total number of voids existing in the silicon substrate is below 0.4.

3. An epitaxial wafer having an epitaxial layer formed at the surface of a silicon substrate wafer having a nitrogen concentration in the range of $3\times10^{13}$ cm$^{-3}$ to $3\times10^{14}$ cm$^{-3}$, wherein the number of bubble-like void aggregates having a plurality of irregular voids aggregated relative to the total number of voids existing in the silicon substrate wafer is below 0.4.

4. The method of claim 1, wherein the epitaxial layer is deposited directly following machining of the silicon wafer.

5. The method of claim 1, wherein the nitrogen concentration is in the range of $5\times10^{13}$ cm$^{-3}$ to $2\times10^{14}$ cm$^{-3}$.

TABLE 1

| Example | Nitrogen Concentration [cm$^{-3}$] | Hydrogen partial pressure [mbar] | Cooling rate at 1200 to 1100° C. [° C./min] | H-induced defects per wafer | N-induced defects per wafer | Ratio of bubble-like void aggregates | Inner diameter of OSF region [mm] | Outer diameter of OSF region [mm] |
|---|---|---|---|---|---|---|---|---|
| Example 1 | $1.8 \times 10^{14}$ | 0.35 | 3.8 | 12 | None | 0.0 | None | None |
| Example 2 | $6.7 \times 10^{13}$ | 0.23 | 3.8 | 14 | None | 0.3 | None | None |
| Comparative Example 1 | $2.5 \times 10^{14}$ | 0.51 | 2.5 | 35 | None | 0.8 | None | None |
| Comparative Example 2 | $1.0 \times 10^{14}$ | 0.00 | 3.8 | None | 267 | 0.0 | 115 | 135 |
| Comparative Example 3 | $3.2 \times 10^{14}$ | 0.35 | 3.8 | 27 | 170 | 1.0 | 135 | 137 |

It should be noted that in all of the epitaxial wafers described in Table 1, the BMD density was equal to or higher than $2\times10^8$ cm$^{-3}$. In the Examples, the generation of H-induced defect was improved compared to the Comparative Examples, while the N-induced defects were not generated.

While embodiments of the invention have been illustrated and described, it is not intended that these embodiments illustrate and describe all possible forms of the invention. Rather, the words used in the specification are words of description rather than limitation, and it is understood that 6. The method of claim 1, wherein the hydrogen partial pressure is from 0.1 mbar to 0.35 mbar.

7. The method of claim 5, wherein the hydrogen partial pressure is from 0.1 mbar to 0.35 mbar.

8. The method of claim 1, wherein the hydrogen partial pressure is from 0.2 mbar to 0.35 mbar.

9. The method of claim 1, wherein the cooling rate of the silicon crystal at 1100° C. to 1150° C. is ≧3.5° C./minute.

* * * * *